(12) United States Patent
Martin et al.

(10) Patent No.: US 8,329,053 B2
(45) Date of Patent: Dec. 11, 2012

(54) MICROMACHINED TRANSDUCERS AND METHOD OF FABRICATION

(75) Inventors: David Martin, Fort Collins, CO (US); Joel Philliber, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 415 days.

(21) Appl. No.: 12/623,768

(22) Filed: Nov. 23, 2009

(65) Prior Publication Data

US 2011/0120971 A1   May 26, 2011

(51) Int. Cl.
*C03C 15/00* (2006.01)
(52) U.S. Cl. ............ 216/58; 216/22; 216/33; 216/38; 216/51
(58) Field of Classification Search .......... 216/22, 216/23, 33, 38, 39, 41, 52, 58, 88, 101, 108, 216/109
See application file for complete search history.

(56) References Cited

U.S. PATENT DOCUMENTS

| | | | |
|---|---|---|---|
| 5,242,863 A * | 9/1993 | Xiang-Zheng et al. | 438/53 |
| 5,462,636 A * | 10/1995 | Chen et al. | 216/67 |
| 5,587,620 A | 12/1996 | Ruby et al. | |
| 5,873,153 A | 2/1999 | Ruby et al. | |
| 6,384,697 B1 | 5/2002 | Ruby | |
| 6,507,983 B1 | 1/2003 | Ruby et al. | |
| 6,635,184 B1 * | 10/2003 | Cohen et al. | 216/22 |
| 6,777,267 B2 | 8/2004 | Ruby et al. | |
| 6,828,713 B2 | 12/2004 | Bradley et al. | |
| 6,830,990 B1 | 12/2004 | Honer et al. | |
| 7,199,449 B2 | 4/2007 | Lake | |
| 7,275,292 B2 | 10/2007 | Ruby et al. | |
| 7,507,638 B2 | 3/2009 | Mancini et al. | |
| 7,579,753 B2 * | 8/2009 | Fazzio et al. | 310/324 |
| 2006/0103492 A1 | 5/2006 | Feng et al. | |
| 2007/0205850 A1 | 9/2007 | Jamneala et al. | |
| 2008/0122317 A1 | 5/2008 | Fazzio et al. | |
| 2008/0122320 A1 | 5/2008 | Fazzio et al. | |
| 2008/0258842 A1 | 10/2008 | Ruby et al. | |

OTHER PUBLICATIONS

Subramanian Rajan, et al. IEEE Ultasonic Transactions (1996), pp. 271-276.*

Dr. Mike Cooke, "Scribe and dice", III-Vs Review, May 2006, p. 20-24, vol. 19, No. 4.

* cited by examiner

*Primary Examiner* — Nadine Norton
*Assistant Examiner* — Maki Angadi

(57) ABSTRACT

In accordance with an illustrative embodiment, a method of fabricating a transducer is described. The method comprises providing a transducer over a first surface of a substrate, wherein the substrate comprises a thickness. The method further comprises patterning a mask over a second surface. The mask comprises an opening for forming a scribe etch. The method comprises etching through the opening in the mask and into but not through the thickness of the substrate to provide the scribe etch.

18 Claims, 4 Drawing Sheets

_US 8,329,053 B2_

MICROMACHINED TRANSDUCERS AND METHOD OF FABRICATION

BACKGROUND

Transducers such as ultrasonic transducers are provided in a wide variety of electronic applications. As the need to reduce the size of many components continues, the demand for reduced-size transducers continues to increase as well. This has lead to comparatively small transducers, which may be micromachined according to technologies such as microelectromechanical systems (MEMS) technology. One type of transducer is a piezoelectric micromachined ultrasonic transducer (PMUT). The PMUT includes a layer of piezoelectric material between two conductive plates (electrodes) thereby forming a membrane. When functioning as a receiver, an acoustic wave incident on the membrane results in the application of a time varying force to the piezoelectric material. Application of the time-varying force to a piezoelectric material results in induced stresses in the piezoelectric material, which in-turn creates a time-varying voltage signal across the material. This time-varying voltage signal may be measured by sensor circuits to determine the characteristics of the incident acoustic wave. Alternatively, this time-varying voltage signal may produce a time-varying charge that is provided to sensor circuits that process the signal and determine the characteristics of the incident acoustic wave. When functioning as a transmitter, a voltage excitation produces vibration of the diaphragm. This in turn radiates acoustic energy into the air (or any gaseous medium).

The layers that comprise the membrane of active area of PMUTs are typically comparatively thin. As can be appreciated, PMUTs are fragile and require delicate handling during processing. For example, after a plurality of PMUTs are fabricated over a wafer, individual PMUTs or groups of PMUTs are separated from one another in a process known as singulation. However, because of the comparatively fragile membrane of the PMUT, many known integrated circuit dicing techniques, such as wafer sawing, are difficult or impossible to use without damaging the fragile membrane.

A common technique used to singulate PMUTs is the scribe-and-break process. However, the process has several drawbacks. A successful scribe-and-break process requires a large aspect ratio of the die length to wafer thickness. This allows enough leverage to be generated to result in a clean break of the wafer. However, such a large die results in a high die cost. An alternative is to the so-called scribe-and-break process involves thinning the wafer comprising the plurality of PMUTs, thus reducing the aspect ratio. Unfortunately, in many PMUT devices a comparatively large cavity is needed to provide desired acoustic properties of the PMUT. As can be appreciated, not only is the thinned die fragile, the desired comparatively deep cavity is reduced by the wafer thinning. Therefore significant wafer thinning is likely to degrade the performance of such devices.

There is a need, therefore, for a method of fabricating a transducer that addresses at least the shortcomings described above.

SUMMARY

In accordance with an illustrative embodiment, a method of fabricating a transducer is described. The method comprises providing a transducer over a first surface of a substrate, wherein the substrate comprises a thickness. The method further comprises patterning a mask over a second surface. The mask comprises an opening for forming a scribe etch. The method comprises etching through the opening in the mask and into but not through the thickness of the substrate to provide the scribe etch.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1:
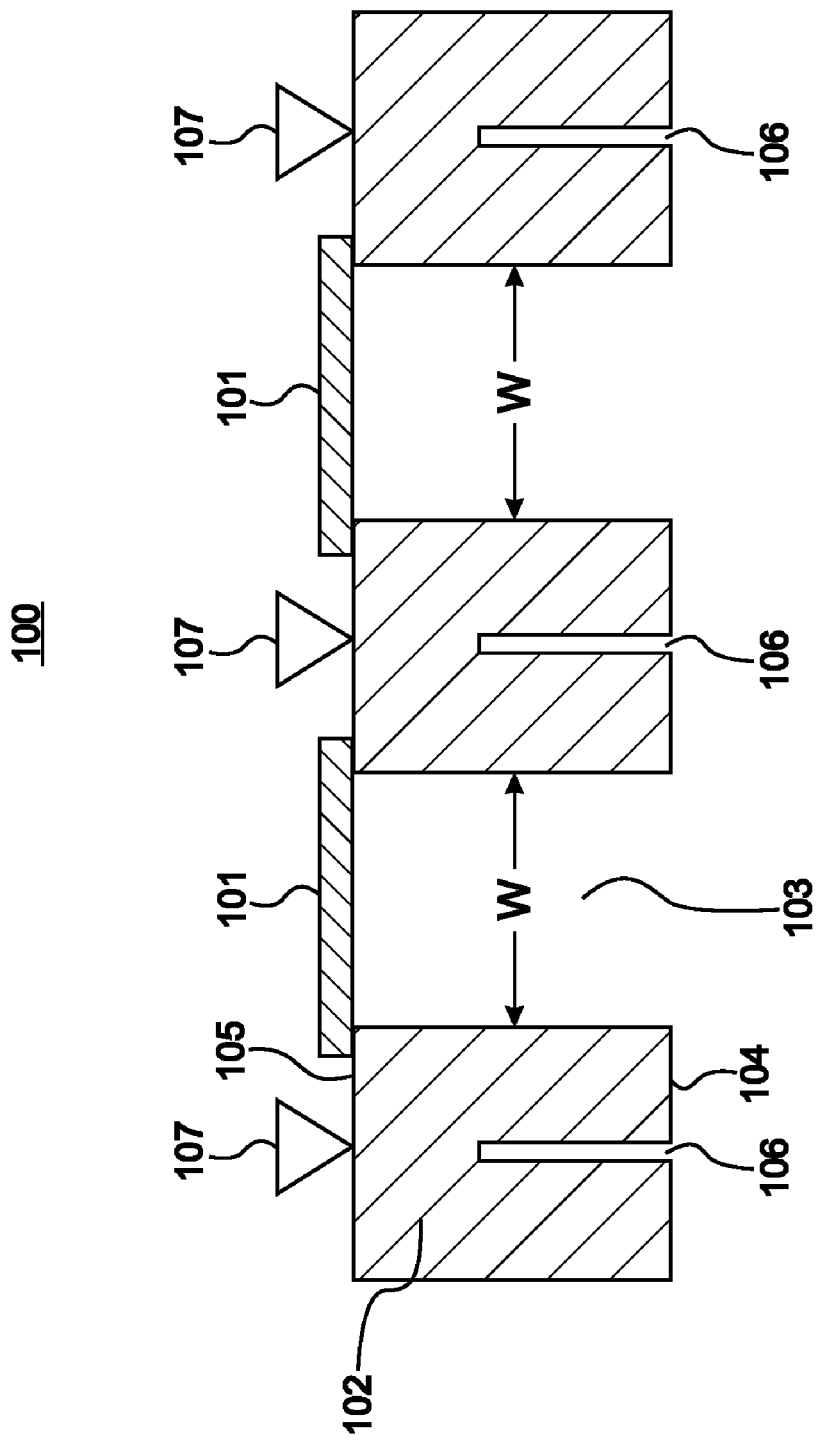
FIG. 1 shows a cross-sectional view of a PMT in accordance with a representative embodiment.

The terms 'a' or 'an', as used herein are defined as one or more than one.

The term 'plurality' as used herein is defined as two or more than two.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of materials and methods may be omitted so as to avoid obscuring the description of the illustrative embodiments. Nonetheless, such materials and methods that are within the purview of one of ordinary skill in the art may be used in accordance with the illustrative embodiments. Such materials and methods are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

The piezoelectric transducers of the representative embodiments are contemplated for use in a variety of electronic devices. A representative electronic device may be a portable device such as a mobile phone, a camera, a video camera, a personal digital assistant (PDA), a sound recording device, a laptop computer, a tablet computer, a handheld computer, a handheld remote, or an electronic device that comprises the functionality of one or more of these devices. Moreover, the piezoelectric transducers of the representative embodiments are contemplated for use in disparate applications such as industrial automation, (e.g., liquid level sensing), detecting the presence of an object, and measuring gas flow. Additionally, the piezoelectric transducers of the representative embodiments can be used to detect mis-feed in automatic paper feeders in printers and scanners. It is emphasized that the noted devices and applications are merely illustrative and that other devices and applications are contemplated.

In many representative embodiments, the electronic devices comprising the transducers are portable. However, this is not essential. For example, in applications such as microphone structures of the transducers of the present teachings are also contemplated for use in devices/apparatuses that are stationary; and devices/apparatuses that are mobile, but are not ordinarily small enough to be considered portable. Illustratively, such microphone structures of representative embodiments may be used in industrial machinery applications, motor vehicle applications, aircraft applications, and watercraft applications, to name only a few.

The description of representative embodiments is directed generally to PMTs and often specifically to PMUTs for a variety of applications. However, it is emphasized that this is merely illustrative and that other types of transducers are contemplated.

FIG. 1 is a cross-sectional view of a device 100 comprising a plurality of PMTs 101 in accordance with an illustrative embodiment. The PMTs 101 are provided over a substrate 102. Each of the PMTs 101 is provided over a respective cavity 103 provided in the substrate 102 according to methods described below. The cavities 103 are through-cavities, which extend from a first surface 104 of the substrate 102 and substantially through the thickness of the substrate 102 to a second surface 105, opposing the first surface 104. The device 100 is shown prior to singulation of the substrate 102 to provide individual PMTs 101 disposed over respective singulated substrates. In accordance with a representative embodiment, a scribe etch 106 is provided adjacent to each of the cavities 103. The scribe etch 106 extends from the first surface 104 into the substrate 102, but does not extend through the thickness of the substrate 102 to the second surface 105. Thus, the scribe etch 106 is not a through-etch, but rather is a partial etch of the substrate. The scribe etch 106 facilitates singulation of the substrate 102 to provide a plurality of individual PMTs 101 or a number of PMTs 101 on a single die.

In a representative embodiment, a fulcrum is created using a diamond tipped scribe tool 107. The diamond tipped scribe tool is then dragged across the second surface 105 of the substrate 102. This results in a micro-crack (referred to as a scribe line) being induced in the substrate 102. Finally, to break the substrate 102, a bending force is created across the scribe line. In a well-tuned process, the break begins at the scribe line and propagates through the thickness of the substrate between the end of the scribe etch 106 and the second surface 105.

In a representative embodiment, the PMTs 101 are illustratively an annular with a diameter that is approximately equal to a width 'w' of the cavity. It is emphasized that annularly-shaped resonators are merely illustrative, and the use of other resonator structures disposed over the substrate 102 with micromachined features such as cavity 103. The PMTs 101 disposed over respective cavities 103 includes characteristics of a film bulk acoustic resonator (FBAR), such as described in patents and patent publications referenced below. While one resonator stack comprising the piezoelectric layer disposed between opposing electrodes are common, more than one resonator stack is contemplated. For example, another resonator stack another piezoelectric layer disposed between additional opposing electrodes may be provided over the resonator stack. This structure has similar characteristics as a stack bulk acoustic resonator (SBAR). The SBAR is fabricated by repeating the fabrication sequence of the resonator stack after forming the resonator stack Application of a time-dependent voltage to the electrodes (not shown) of the PMTs 101 causes a mechanical wave to be launched through the PMT 101, via the cavity 103. Alternatively, as the piezoelectric layer (not shown) of the PMT 101 oscillates in response to a mechanical perturbation (e.g., a sound wave), the forces generated by the perturbation induce stresses in the piezoelectric layer resulting in generation of a voltage difference across the electrodes. Mechanical waves launched from or incident on the PMTs 101 travel through a cavity 103. Further details of the structure and function of the PMTs 101 may be found for example in U.S. patent application Ser. No. 12/495,443, entitled "Piezoelectric Micromachined Transducers" to David Martin, et al., and filed on Jun. 30, 2009; and U.S. patent application Ser. No. 12/570,298 "Temperature Control of Micromachined Transducers" to David Martin, et al., filed on Sep. 30, 2009. The entire disclosures of these U.S. patent applications are specifically incorporated herein by reference.

Figures 2A, 2B, 2C:
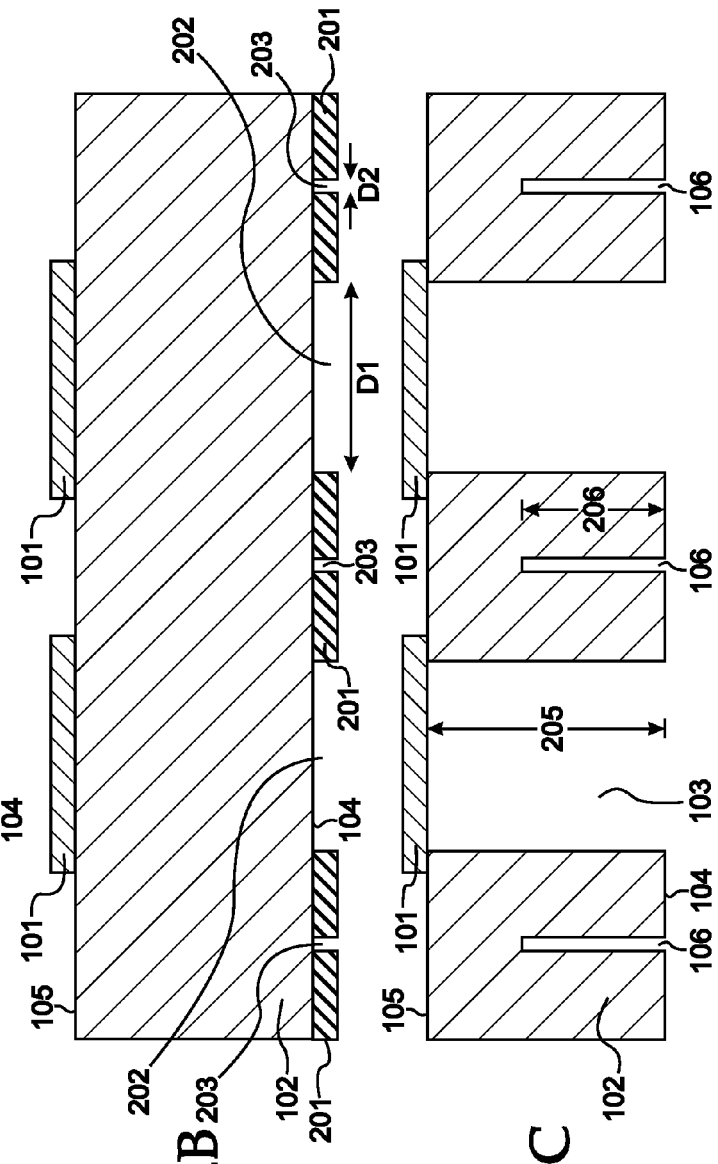
FIGS. 2A-2C shows cross-sectional views of a fabrication sequence in accordance with a representative embodiment.

FIGS. 2A-2C show cross-sectional views of a fabrication sequence in accordance with a representative embodiment. Methods, materials and structures of the PMT 100 may be as described in commonly owned U.S. Patent Application Publications: 20080122320 and 20080122317 to Fazzio, et al.; 20070205850 to Jamneala, et al.; 20080258842 to Ruby, et al.; and 20060103492 to Feng, et al.; and may be as described in commonly owned U.S. Pat. Nos. 5,587,620; 5,873,153; 6,384,697; 6,507,983; and 7,275,292 to Ruby, et al.; U.S. Pat. No. 6,828,713 to Bradley, et. al. The disclosures of these patents and patent application publications are specifically incorporated herein by reference. Notably, the teachings of these patents and patent publications is intended to be illustrative of methods, materials and structures useful to the present teachings, but in no way limiting to the present teachings.

FIG. 2A shows the substrate 102 having PMTs 101 formed therein by a known method. In accordance with a representative embodiment, the substrate 102 is monocrystalline silicon. In other embodiments, the substrate 102 may comprise silicon-on-insulator (SOI), or may comprise a first silicon wafer bonded to a second silicon wafer, which is thinned by a known thinning process to provide a desired thickness of the substrate 102. The PMTs 101 are fabricated by a selected method to provide a selected structure, such as for example, as described in the incorporated patent applications to Martin, et al. Notably, as disclosed in the incorporated patent applications, the PMTs 101 may include a membrane layer (not shown). The membrane layer comprises monocrystalline silicon; or polycrystalline silicon (polysilicon) formed by low pressure chemical vapor deposition (LPCVD) or by plasma enhanced chemical vapor deposition (PECVD); or silicon carbide (SiC); or silicon nitride $Si_3N_4$. In other embodiments, the substrate 102 is monocrystalline silicon and the membrane layer comprises boron-doped silicon glass (borosilicate glass) with a boron concentration by weight of approximately 3.0% to approximately 6.0%.

FIG. 2B shows masks 201 provided over the first surface 104 of the substrate 102. The masks 201 provide a first opening 202 and a second opening 203. The first opening 202 has a width '$D_1$' and the second opening has a width '$D_2$.' The first opening 202 is used to form the cavity 103, and the second opening 203 to form the scribe etch 106. The placement of the second opening 203 is on the first surface 104 of the substrate 102 and between the PMTs 101, and each of the respective first openings 202 is on the first surface 104, beneath and directly opposing a respective PMT 101. In a representative embodiment, the mask comprises a material selected for the type of etching process selected. The etching processes selected are illustratively anisotropic, and can be a wet-etch process or a dry-etch process. In certain embodiments, the mask material comprises a known photoresist, and in other embodiments, the mask material comprises a hard-mask, such as $SiO_2$ or $Si_3N_4$. The selected material is deposited over the first surface 104 and is patterned to provide the openings 202, 203.

The width $D_1$ of the first opening 202 is selected to foster etching through the thickness of the substrate 102 (i.e., from the first surface 104 to the second surface) to reveal the PMT 103. By contrast, the width $D_2$ is selected to foster etching not through the entire thickness of the substrate (i.e., beginning at the first surface 104, but terminating at a distance from the second surface 105). Notably, the depth of an anisotropic etch is related to the width of the opening in the mask. As such, wider opening (e.g., first opening 202), provides a greater the depth (e.g., through the thickness of the substrate 102), whereas a narrower opening (e.g., opening 203) provides a shallower depth (e.g., terminating at a distance from the second surface), because the etch rates are limited by the width of the opening in the mask 201. The so-called Bosch etching process, a known deep reactive ion etching process, is particularly well suited for this process. This etch typically has a fast etch time for larger openings and will yield the desired result. Alternatively, the etch can be designed to self-terminate at the desired depth based on the dimension of the second opening 203. Notably, the Bosch etch method can be made to be self terminating. The etch is designed to provide a closing profile. When this is combined with a small feature size of the second opening 203 of the mask 201, the etch terminates before etching through the thickness of the substrate 102. In any case, a wider second opening 203 for the scribe etch will results in a deeper etch.

As referenced above, the width of the first opening 202 ($D_1$) is larger than the width of the second opening 203 ($D_2$) to foster a wider and deeper etch to provide cavity 103; whereas the second opening 203 is comparatively narrow to provide a narrower etch that terminates at a distance from the second surface 105. Illustratively, the width of the first opening 202 is approximately 500 µm to approximately 1000 µm and allows etching through a thickness of the substrate 102, which is illustratively 500 µm. By contrast, the width of the second opening 203 is approximately 5 µm to approximately 10 µm. The width of the second opening 203 provides an etch depth into the substrate of approximately 250 µm, or approximately one-half of the substrate thickness.

FIG. 2C shows the device 100 after etching and removal of the masks 201. The depth 205 of the cavity 103 is substantially equal to the thickness of the substrate 102. By providing for the depth 205 of the cavity 103 to be substantially equal to the thickness of the substrate 102, suitable coupling of mechanical waves to and from the PMT 101 disposed over the second surface 105 is realized. By contrast, methods of singulating die that require substrate 102 thinning will result in cavities having a lesser depth than depth 205, and a reduction in coupling of mechanical waves to and from the PMT 101.

While the depth 205 of the cavity 103 provides the requisite depth for coupling of mechanical wave, the scribe etch 106 has a lesser depth, approximately one-half of the thickness of the substrate 102. The depth 205 is sufficient to allow for scribing the second surface 105 to allow cleaving and singulation of the substrate 102. Notably, however, because the thickness of the substrate 102 is maintained at locations other than the cavity 103 and the scribe etch 106, the substrate 102 is robust and withstands handling during processing before the scribing and singulation. By contrast, methods of singulating die that include thinning the substrate 102 can present issues with breakage during processing during singulation.

FIG. 2B shows the substrate 102, having the cavity 103 substantially filled with a sacrificial material. As described in the incorporated patents and patent publications, the sacrificial material is illustratively silicon dioxide ($SiO_2$) or phosphosilicate glass (PSG) formed using a known deposition or growth method. After the sacrificial layer is provided in the cavity 103, a polishing step, such as chemical mechanical polishing (CMP) is performed so that a surface 202 of the sacrificial layer is substantially flush with a surface 203 of the substrate 102. FIG. 2C shows the substrate 102 after the forming of the cavities 103. In accordance with a representative embodiment, the membrane layer comprises boron doped $SiO_2$ commonly referred to as borosilicate glass (BSG). In other representative embodiments, the membrane layer comprises one of polysilicon (poly-Si), or silicon nitride ($Si_3N_4$) or silicon carbide (SiC). These materials are merely illustrative, and other materials are contemplated for use as the membrane layer. Notably, the material selected for the membrane should be reproducibly fabricated with consistent desired material properties such as film stress and thickness in an array of PMTs 101 or across a wafer in large-scale fabrication. Accordingly, to realize sufficient accuracy in the resonant frequency, and reproducibility from one transducer (PMT) to the next in fabrication, it is important to control the thickness of the membrane layer and the film stress of the membrane layer. In choosing the material, other parameters of interest are stiffness, robustness, environmental compatibility. Illustratively, a layer of BSG having a thickness in the range of approximately 0.1 µm to approximately 20.0 µm may be used for the membrane layer.

Figure 3A:
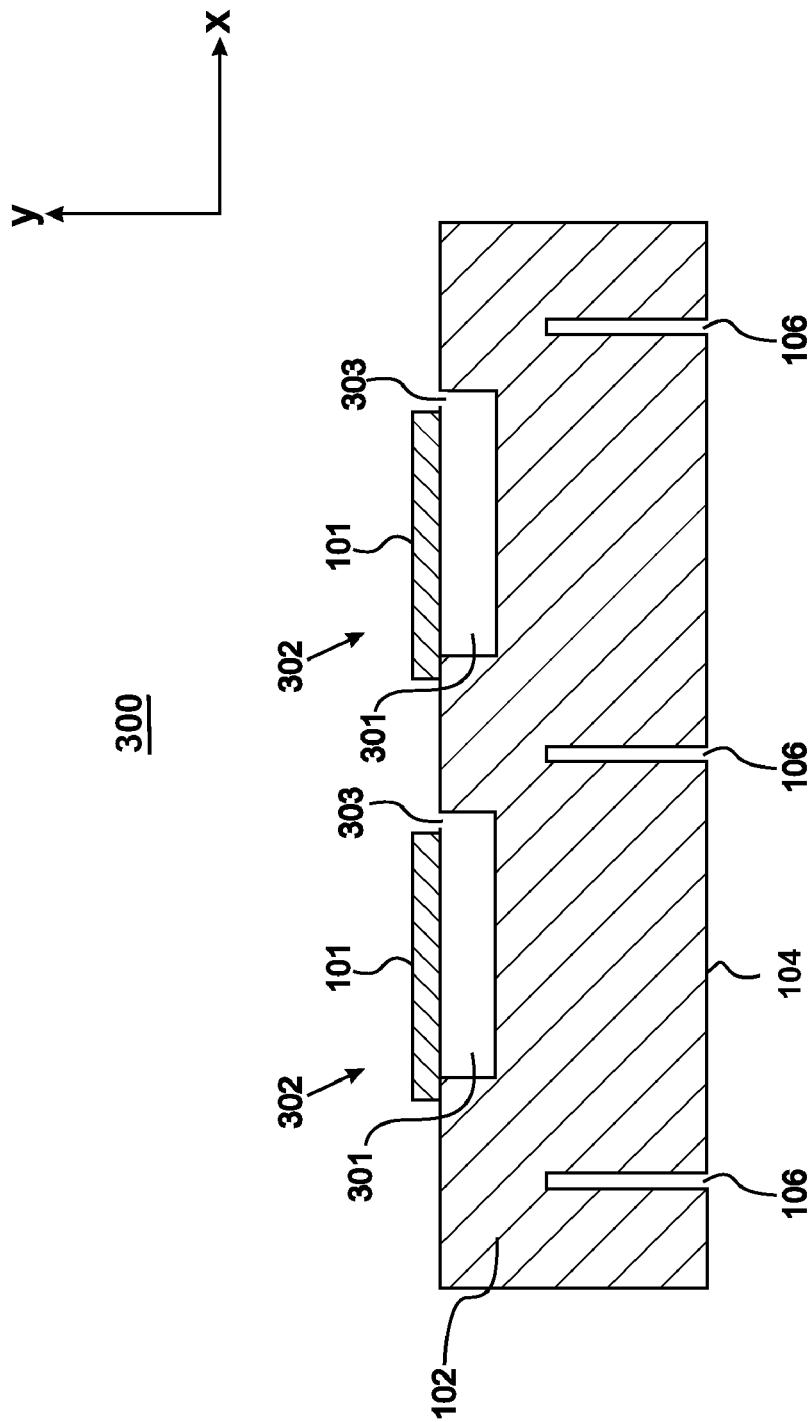
FIG. 3A shows a cross-sectional view of a PMT in accordance with a representative embodiment.
Figure 3B:
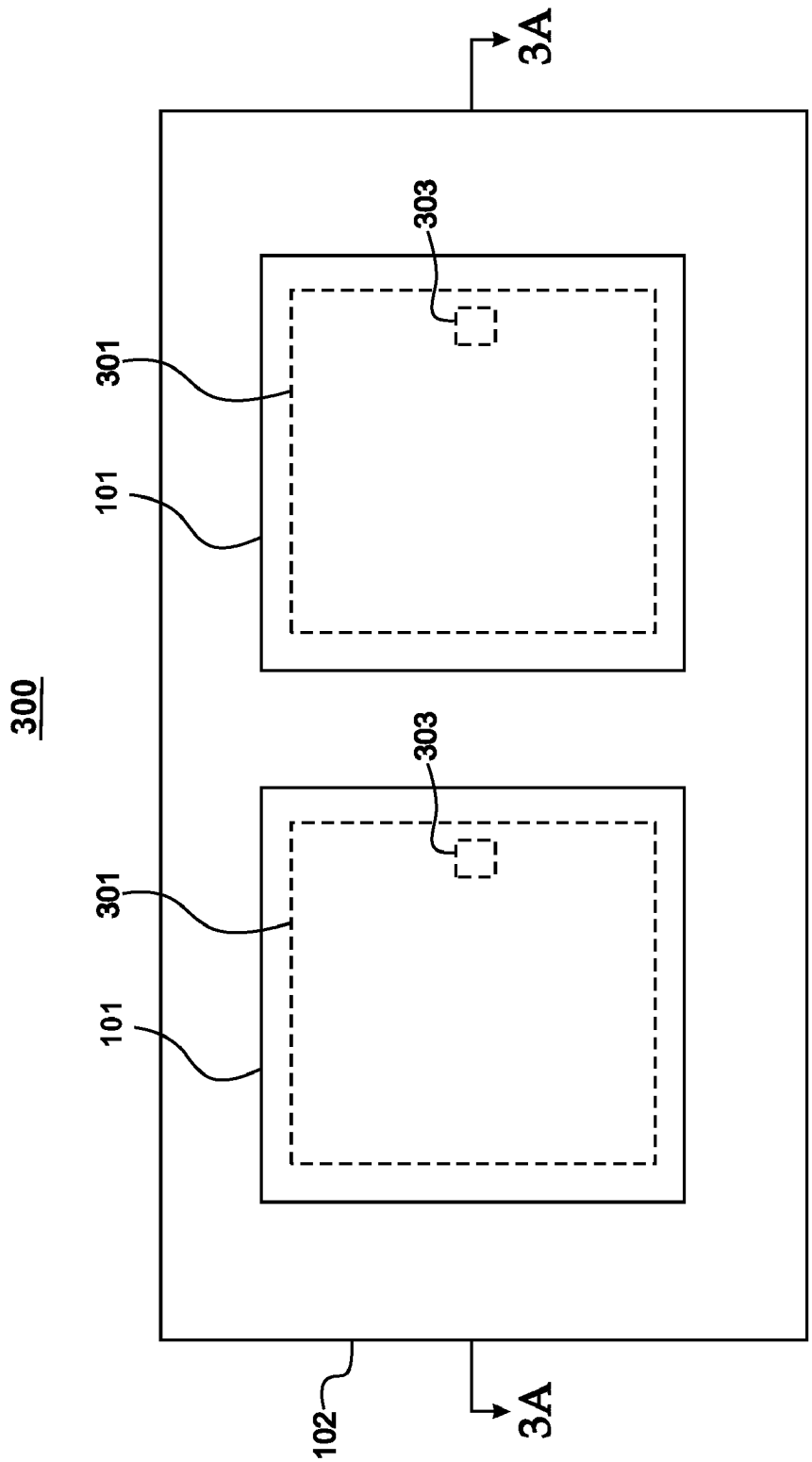
FIG. 3B is a top view of a PMT of the PMT shown in FIG. 3A in accordance with a representative embodiment.

FIG. 3A shows a PMT device 300 in cross-section in accordance with a representative embodiment taken along the line 3A-3A of FIG. 3B. Many of the features, materials and methods of fabricating the PMT device 300 are common to those above provided in connection with the embodiments of FIGS. 1-2C. Generally, common details are not repeated to avoid obscuring the description of the presently described embodiments.

The PMT device 300 comprises PMTs 101 disposed over substrate 102. The PMT device 300 also comprises a cavity 301 formed in the substrate 102 and beneath the PMT 101. The PMT device 300 does not comprise the cavity 103 as provided in other embodiments described above. Notably, the PMT device 300 is designed so that mechanical waves are transmitted to or received from a side 302, which is the side of the PMT device 300 opposing the first surface 104 of the substrate 102. In order to facilitate a flexure mode of a suitable amplitude in the membrane layer, a vent 303 is provided to foster pressure equalization between the pressures on each side of the PMT 101. Thus, the vent 303 promotes equal pressure in the cavity 301 as in the ambient region of the PMT 300.

Application of a time-dependent voltage to the PMT 101 causes a mechanical wave to be launched through the PMT 101. As the piezoelectric layer (not shown) of the PMT oscillates in response to a mechanical perturbation (e.g., a sound wave), the forces generated by the perturbation induce stresses in the piezoelectric layer resulting in generation of a voltage difference across the electrodes (not shown) of the PMT 101. Assuming the layer of piezoelectric material (e.g., AlN, ZnO or lead zirconium titanate (PZT)) has a c-axis substantially orthogonal to the membrane surface (parallel to the y-axis in the coordinate system shown), the voltage sensitivity is proportional to the lateral stress, $\sigma_y$, and the ratio of the piezoelectric strain matrix coefficient ($d_{31}$) and the electric permittivity coefficient ($\epsilon_{33}$). Beneficially, the mechanical wave creates a flexure mode to be launched in the PMT 101. Mechanical waves launched from the PMT 101 travel from side 302. Similarly, in a receiving mode, mechanical waves incident on an the PMT 101 are converted into flexural modes in the piezoelectric layer and to time-dependent voltages due to the piezoelectric affect.

As will be appreciated by one of ordinary skill in the art, many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method of fabricating a transducer, the method comprising:
    providing a transducer over a first surface of a substrate, wherein the substrate comprises a thickness;
    patterning a mask over a second surface, wherein the mask comprises an opening for forming a scribe etch; and
    etching through the opening in the mask and into but not through the thickness of the substrate to provide the scribe etch.

2. A method as claimed in claim 1, wherein the opening is a first opening, and the mask further comprises a second opening beneath the transducer over the second surface and substantially opposing the transducer.

3. A method as claimed in claim 2, wherein the method further comprises:
    etching through the second opening and through the thickness of the substrate.

4. A method as claimed in claim 3, wherein the etching through the first and second openings is done substantially simultaneously.

5. A method as claimed in claim 4, wherein the etching comprises deep reactive ion etching (DRIE).

6. A method as claimed in claim 2, wherein the first opening comprises a first width, and the second opening comprises a second width that is greater than the first width.

7. A method as claimed in claim 6, wherein a ratio of the second width to the first width is in the range of approximately 50:1 to approximately 100:1.

8. A method as claimed in claim 1, further comprising forming a cavity in the substrate beneath the transducer.

9. A method as claimed in claim 1, wherein the transducer comprises a bulk acoustic wave (BAW) transducer.

10. A method as claimed in claim 1, wherein the transducer comprises annular contacts having a diameter that is greater than or equal to a width of the opening.

11. A method of fabricating transducers, the method comprising:
    providing a plurality of transducers spaced apart over a first surface of a wafer substrate, the wafer substrate having a corresponding thickness;
    patterning a mask over a second surface of the wafer substrate opposite the first surface, wherein the mask comprises a plurality of first openings located opposite the plurality of transducers, respectively, and at least one second opening located between adjacent first openings of the plurality of first openings; and
    etching substantially simultaneously through the second surface a plurality of cavities corresponding to the plurality of first openings and at least one scribe etch corresponding to the at least one second opening, wherein each of the plurality of cavities extends through the thickness of the wafer substrate and the at least one scribe etch extends through a portion of the thickness of the substrate, less than the thickness of the substrate.

12. The method as claimed in claim 11, wherein the portion of the thickness of the wafer substrate through which the at least one scribe etch extends is about half of the thickness of the wafer substrate.

13. The method as claimed in claim 11, wherein the substantially simultaneous etching comprises an anisotropic etch, which provides depths related to corresponding widths of the first and second openings in the mask, respectively.

14. The method as claimed in claim 11, further comprising:
    separating the plurality of transducers at the at least one scribe etch into corresponding dies.

15. The method as claimed in claim 14, wherein separating the plurality of transducers comprises creating a fulcrum on the first surface of the wafer substrate opposite each of the at least one scribe etch and applying a bending force across the fulcrum.

16. The method as claimed in claim 15, wherein creating the fulcrum comprises forming a scribe line on the first surface of the wafer substrate opposite each of the at least one scribe etch.

17. The method as claimed in claim 16, wherein forming the scribe line comprises dragging a diamond tipped scribe tool across the first surface of the wafer substrate.

18. A method of fabricating transducers, the method comprising:
    providing a plurality of transducers spaced apart over a first surface of a wafer substrate, the wafer substrate having a corresponding thickness;
    patterning a mask over a second surface of the wafer substrate opposite the first surface, wherein the mask comprises a plurality of first openings located opposite the plurality of transducers, respectively, and at least one second opening located between adjacent first openings of the plurality of first openings;
    etching substantially simultaneously a plurality of cavities corresponding to the plurality of first openings and at least one scribe etch corresponding to the at least one second opening, wherein each of the plurality of cavities extends through the thickness of the wafer substrate and the at least one scribe etch extends through a portion of the thickness of the substrate, less than the thickness of the substrate;
    forming a scribe line on the first surface of the wafer substrate opposite each of the at least one scribe etch; and
    applying a bending force across the scribe line to separate adjacent transducers of the plurality of transducers from one another.

* * * * *